(12) United States Patent
Takahashi et al.

(10) Patent No.: US 10,319,936 B2
(45) Date of Patent: Jun. 11, 2019

(54) LIGHT-EMITTING DEVICE, METHOD OF MANUFACTURING LIGHT-EMITTING DEVICE, AND LIGHT-EMITTING SYSTEM

(71) Applicants: Pioneer Corporation, Tokyo (JP); Tohoku Pioneer Corporation, Tendo-shi, Yamagata (JP)

(72) Inventors: Masaki Takahashi, Yonezawa (JP); Hiroki Tan, Yonezawa (JP); Noriaki Waki, Yonezawa (JP)

(73) Assignees: PIONEER CORPORATION, Tokyo (JP); TOHOKU PIONEER CORPORATION, Tendo-Shi, Yamagata (JP)

( * ) Notice: Subject to any disclaimer, the term of this patent is extended or adjusted under 35 U.S.C. 154(b) by 0 days.

(21) Appl. No.: 15/686,771

(22) Filed: Aug. 25, 2017

(65) Prior Publication Data

US 2017/0373268 A1    Dec. 28, 2017

Related U.S. Application Data

(63) Continuation of application No. PCT/JP2016/054726, filed on Feb. 18, 2016.

(30) Foreign Application Priority Data

Feb. 25, 2015   (JP) ................. 2015-035822

(51) Int. Cl.
*H01L 51/00* (2006.01)
*H01L 51/52* (2006.01)
(Continued)

(52) U.S. Cl.
CPC ........ *H01L 51/5221* (2013.01); *H01L 27/326* (2013.01); *H01L 27/3239* (2013.01);
(Continued)

(58) Field of Classification Search
CPC ............. H01L 51/5221; H01L 51/5268; H01L 27/3239; H01L 51/56; H01L 51/0015;
(Continued)

(56) References Cited

U.S. PATENT DOCUMENTS

| | | |
|---|---|---|
| 7,242,375 B2 | 7/2007 | Hayashi et al. |
| 7,375,463 B2 | 5/2008 | Uemura et al. |

(Continued)

FOREIGN PATENT DOCUMENTS

| | | |
|---|---|---|
| CN | 102593149 A | 7/2012 |
| CN | 103974484 A | 8/2014 |

(Continued)

OTHER PUBLICATIONS

International Search Report and Written Opinion for PCT App No. PCT/JP2016/054126 dated May 10, 2016, 10 pgs.
(Continued)

*Primary Examiner* — Vu A Vu
(74) *Attorney, Agent, or Firm* — Procopio, Cory, Hargreaves & Savitch LLP

(57) ABSTRACT

A substrate (100) has optical transparency, and a light-emitting unit (140) is formed on the substrate (100). The light-emitting unit (140) includes a first electrode (110), an organic layer (120), and a second electrode (130). The organic layer (120) is located between the first electrode (110) and the second electrode (130). The second electrode (130) extends outside the light-emitting unit (140). At least an end of a portion of the second electrode (130) which is located outside the light-emitting unit (140) is oxidized.

20 Claims, 21 Drawing Sheets

(51) Int. Cl.
  *H01L 51/50* (2006.01)
  *H01L 27/32* (2006.01)
  *H01L 51/56* (2006.01)

(52) U.S. Cl.
  CPC ...... *H01L 51/0015* (2013.01); *H01L 51/0097* (2013.01); *H01L 51/50* (2013.01); *H01L 51/5206* (2013.01); *H01L 51/5225* (2013.01); *H01L 51/5237* (2013.01); *H01L 51/5268* (2013.01); *H01L 51/56* (2013.01); *H01L 2251/533* (2013.01); *H01L 2251/5338* (2013.01); *H01L 2251/5392* (2013.01)

(58) Field of Classification Search
  CPC ............ H01L 51/0097; H01L 51/5237; H01L 51/5206; H01L 2251/5338; H01L 2251/533; H01L 2251/5392
  USPC .......................................................... 257/40
  See application file for complete search history.

(56) References Cited

U.S. PATENT DOCUMENTS

| | | | |
|---|---|---|---|
| 8,319,419 B2 | 11/2012 | Kodama et al. | |
| 8,779,658 B2 | 7/2014 | Hayashi et al. | |
| 9,065,074 B2 | 6/2015 | Hayashi et al. | |
| 9,450,204 B2 | 9/2016 | Hayashi et al. | |
| 9,490,311 B2 | 11/2016 | Park et al. | |
| 2004/0124770 A1 | 7/2004 | Hayashi et al. | |
| 2005/0111211 A1 | 5/2005 | Takeuchi | |
| 2006/0055319 A1 | 3/2006 | Uemura et al. | |
| 2006/0186803 A1* | 8/2006 | Lim ................... H01L 51/5281 313/506 |
| 2007/0224907 A1 | 9/2007 | Hayashi et al. | |
| 2009/0289875 A1 | 11/2009 | Hayashi et al. | |
| 2010/0314616 A1 | 12/2010 | Kodama et al. | |
| 2011/0220899 A1 | 9/2011 | Park et al. | |
| 2014/0218921 A1* | 8/2014 | Okawa ................... H01L 25/048 362/249.01 |
| 2014/0264317 A1 | 9/2014 | Uezawa et al. | |
| 2014/0349413 A1* | 11/2014 | Chung ................... H01L 43/12 438/3 |
| 2015/0028304 A1 | 1/2015 | Hayashi et al. | |
| 2015/0188077 A1* | 7/2015 | Kim ................... H01L 51/5203 257/40 |
| 2015/0249227 A1 | 9/2015 | Hayashi et al. | |
| 2015/0333288 A1 | 11/2015 | Sugi et al. | |
| 2016/0240811 A1* | 8/2016 | Kim ................... H01L 51/5234 |
| 2017/0077404 A1 | 3/2017 | Park et al. | |

FOREIGN PATENT DOCUMENTS

| | | | | |
|---|---|---|---|---|
| JP | 2004-146244 | A | 5/2004 | |
| JP | 2005-063839 | A | 3/2005 | |
| JP | 2005-183352 | A | 7/2005 | |
| JP | 2011-023336 | A | 2/2011 | |
| JP | 2011-154795 | A | 8/2011 | |
| JP | 2011-187431 | A | 9/2011 | |
| JP | 2012-084371 | A | 4/2012 | |
| JP | 2014-154404 | A | 8/2014 | |
| KR | 10-2015-0023198 | | * 2/2015 | ......... H01L 51/5234 |
| WO | 2013073301 | A1 | 5/2013 | |

OTHER PUBLICATIONS

Office Action for related CN App No. 201680011995.9 dated Jul. 3, 2018, 11 pgs.

Office Action for related KR App No. 10-2017-7026525 dated Mar. 23, 2019, 5 pgs.

\* cited by examiner

LIGHT-EMITTING DEVICE, METHOD OF MANUFACTURING LIGHT-EMITTING DEVICE, AND LIGHT-EMITTING SYSTEM

CROSS-REFERENCE TO RELATED APPLICATIONS

This application is a Continuation Application of PCT Application No: PCT/JP2016/054728 filed Feb. 18, 2016, which claims priority to Japanese Application No: 2015-035822, filed Feb. 25, 2015, the contents of which are incorporated herein by reference.

TECHNICAL FIELD

The present invention relates to a light-emitting device, a method of manufacturing a light-emitting device, and a light-emitting system.

BACKGROUND ART

In recent years, there has been progress in the development of light-emitting devices using organic EL. Such light-emitting devices are used as illumination devices or display devices, and have a configuration in which an organic layer is interposed between a first electrode and a second electrode. Generally, a transparent material is used in the first electrode, and a metal material is used in the second electrode.

Patent Document 1 discloses the technique of a light-emitting device using such organic EL. In the technique of Patent Document 1, the second electrode is provided only in a portion of a pixel in order to provide a display device using an organic EL with optical transparency (see-through performance). In such a structure, since a region located between a plurality of second electrodes transmits light, the display device is capable of having optical transparency. Meanwhile, in the technique disclosed in Patent Document 1, a light-transmitting insulating film is formed between the plurality of second electrodes in order to define a pixel. Examples of materials of the insulating film of Patent Document 1 include an inorganic material such as a silicon oxide and a resin material such as an acrylic resin.

In addition, Patent Document 2 discloses forming a second electrode in a mesh shape and specifying the mesh pitch, thereby improving the visibility of an image passed through the light-emitting device.

RELATED DOCUMENTS

Patent Documents

[Patent Document 1] Japanese Unexamined Patent Application Publication No. 2011-23336
[Patent Document 2] Japanese Unexamined Patent Application Publication No. 2014-154404

SUMMARY OF THE INVENTION

In order for a light-emitting device to have optical transparency, it is necessary that a region without a second electrode is set in the light-emitting device. In order to do so, it is necessary that the second electrode is patterned. An example of a patterning method includes using a mask during vapor deposition, or the like. However, when patterning the second electrode, the vapor deposition material leaks out from a gap between the mask and a substrate, and thus the end of the second electrode spreads toward the outer side of the second electrode. As result, there is a risk of the region without the second electrode becoming narrower, causing the optical transparency of the light-emitting device to decrease.

An example of the problem to be solved by the present invention is to prevent the optical transparency of a light-emitting device from decreasing.

Means for Solving the Problem

According to the invention of claim 1, there is provided a light-emitting device including:
a light-transmitting substrate; and
a light-emitting unit formed on a first surface of the substrate,
wherein the light-emitting unit includes a first electrode, a second electrode, and an organic layer between the first electrode and the second electrode, and
the second electrode extends outside the light-emitting unit, at least an end of a portion of the second electrode located outside the light-emitting unit being oxidized.

According to the invention of claim 10, there is provided a method of manufacturing a light-emitting device, including the steps of:
forming a first electrode over a light-transmitting substrate;
forming an insulating layer that covers an edge of the first electrode and defines a light-emitting unit;
forming an organic layer over the first electrode;
forming a second electrode over the organic layer; and
oxidizing an end of a portion of the second electrode located outside the light-emitting unit.

According to the invention of claim 14, there is provided a light-emitting system including:
a light-transmitting partition member that partitions a space from an exterior thereof;
a light-transmitting substrate disposed on a surface of the partition member on the space side; and
a light-emitting unit disposed on the substrate,
wherein the light-emitting unit includes a first electrode, a second electrode, and an organic layer between the first electrode and the second electrode, and
the second electrode extends outside the light-emitting unit, at least an end of a portion of the second electrode located outside the light-emitting unit being oxidized.

BRIEF DESCRIPTION OF THE DRAWINGS

The above and other objects, features and advantages will be made clearer from certain preferred embodiment described below, and the following accompanying drawings.

DESCRIPTION OF EMBODIMENTS

Figure 1:
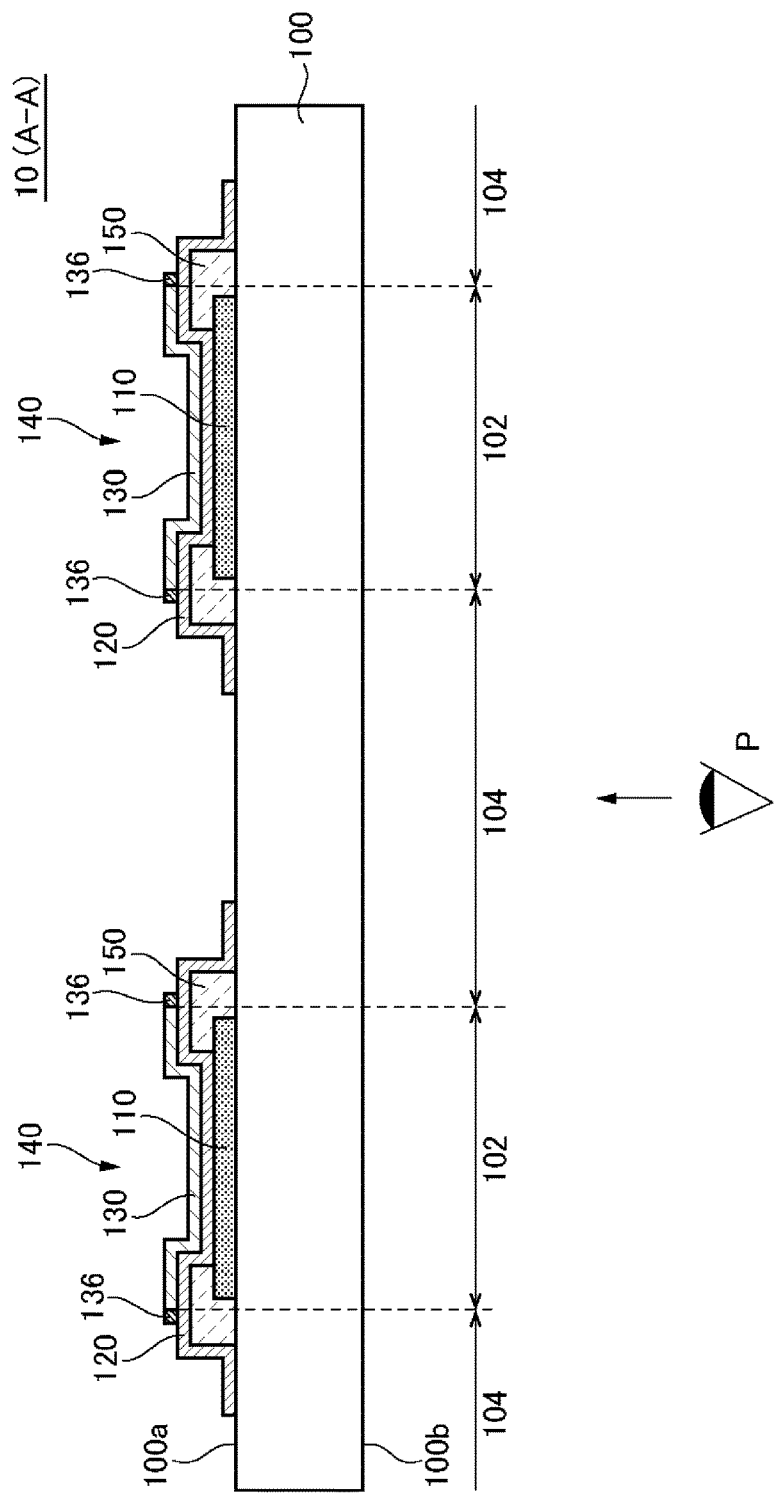
FIG. 1 is a cross-sectional view illustrating a configuration of a light-emitting device according to a first embodiment.

Hereinafter, embodiments of the present invention will be described with reference to the accompanying drawings. In all the drawings, like elements are referenced by like reference numerals and the descriptions thereof will not be repeated.

First Embodiment

Figure 2:
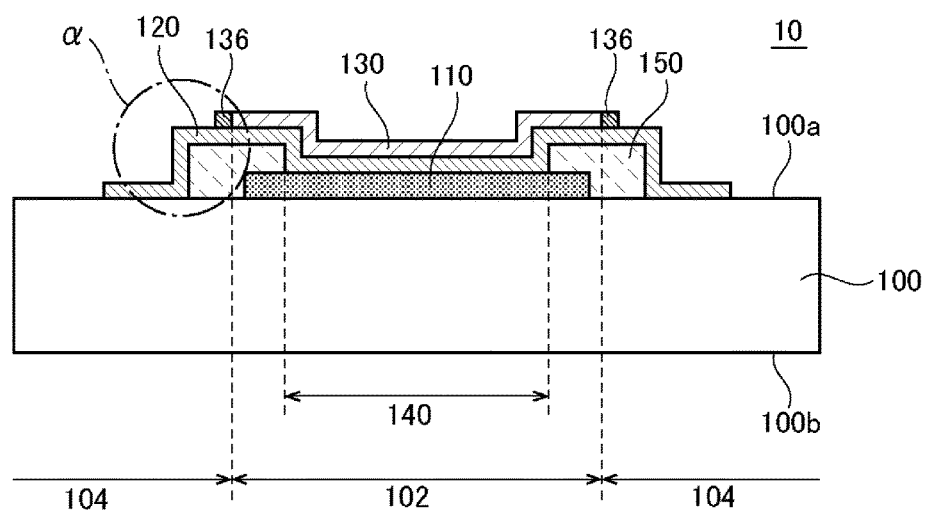
FIG. 2 is an enlarged view of a main part of FIG. 1.

FIG. 1 is a cross-sectional view illustrating a configuration of a light-emitting device 10 according to a first embodiment. FIG. 2 is an enlarged view of a main part of FIG. 1. The light-emitting device 10 according to the first embodiment includes a substrate 100 and a light-emitting unit 140. The substrate 100 has optical transparency, and the light-emitting unit 140 is formed on a first surface 100a of the substrate 100. The light-emitting unit 140 includes a first electrode 110, an organic layer 120, and a second electrode 130. The organic layer 120 is located between the first electrode 110 and the second electrode 130. The second electrode 130 extends outside the light-emitting unit 140. At least an end of a portion of the second electrode 130 located outside the light-emitting unit 140 is oxidized. Hereinafter, a detailed description will be given.

The light-emitting device 10 is a bottom-emission type illumination device, and is configured such that light is radiated from a second surface 100b of the substrate 100. The substrate 100 is a substrate, such as, for example, a glass substrate or a resin substrate, through which visible light passes. In addition, the substrate 100 may have flexibility. In such a case, the light-emitting device 10 may be used with the substrate 100 in a curved state. In a case where the substrate has flexibility, the thickness of the substrate 100 is, for example, equal to or greater than 10 μm and equal to or less than 1,000 μm. The substrate 100 is polygonal such as, for example, rectangular. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of SiNx, SiON or the like is formed on at least one surface (preferably, both surfaces) of the substrate 100 in order to prevent moisture from permeating the substrate 100. Meanwhile, a planarization layer (for example, an organic layer) may be provided between the inorganic barrier film and the substrate 100.

The light-emitting unit 140 is repeatedly provided along a first direction on the first surface 100a of the substrate 100. The light-emitting unit 140 includes a configuration in which the first electrode 110, the organic layer 120, and the second electrode 130 are laminated in this order.

The first electrode 110 is a transparent electrode having optical transparency. A material of the transparent electrode is a metal oxide formed of a material containing a metal, for example, an indium tin oxide (ITO), an indium zinc oxide (IZO), an indium tungsten zinc oxide (IWZO), a zinc oxide (ZnO) or the like. The thickness of the first electrode 110 is, for example, equal to or greater than 10 nm and equal to or less than 500 nm. The first electrode 110 is formed using, for example, sputtering or vapor deposition. Meanwhile, the first electrode 110 may be a conductive organic material such as carbon nanotubes or PEDOT/PSS.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed using vapor deposition. In addition, at least one layer of the organic layer 120, for example, a layer which is in contact with the first electrode 110, may be formed using a coating method such as ink jetting, printing, or spraying. Meanwhile, in this case, the remaining layers of the organic layer 120 are formed using vapor deposition. In addition, all layers of the organic layer 120 may be formed using a coating method.

The second electrode 130 includes a metal layer constituted of a metal selected from a first group including materials through which visible light does not pass, for example, Al, Au, Ag, Pt, Mg, Sn, Zn, and In, or an alloy of metals selected from the first group. In this case, the second electrode 130 has light shielding characteristics. The thickness of the second electrode 130 is, for example, equal to or greater than 10 nm and equal to or less than 500 nm. However, the second electrode 130 may be formed using a material exemplified as the material of the first electrode 110. The second electrode 130 is formed using, for example, sputtering or vapor deposition.

In addition, the edge of the first electrode 110 is covered with an insulating layer 150. The insulating layer 150 is formed of a photosensitive resin material such as, for example, polyimide, and surrounds a portion of the first electrode 110, the portion serving as the light-emitting unit 140. In other words, the light-emitting unit 140 is defined by the insulating layer 150. By providing the insulating layer 150, it is possible to prevent the first electrode 110 and the second electrode 130 from being short-circuited at the edge of the first electrode 110. The insulating layer 150 is formed, for example, by coating a resin material serving as the insulating layer 150, and then exposing and developing the resin material.

The second electrode 130 extends outside the light-emitting unit 140. In other words, the laminated structure of the first electrode 110 and the organic layer 120 is not present below a portion of the second electrode 130. In the example shown in the drawing, the end of the second electrode 130 is located over the insulating layer 150. In addition, the width of the second electrode 130 is larger than the width of the first electrode 110. For this reason, the end of the second electrode 130 does not overlap the first electrode 110. However, the width of the second electrode 130 may be smaller than the width of the first electrode 110. In addition, the organic layer 120 extends outside the light-emitting unit 140 through the lateral side and upper surface of the insulating layer 150.

In addition, the light-transmitting region 104 is provided next to the light-emitting unit 140. The light-transmitting region 104 is a region through which visible light passes. Specifically, a region of the light-emitting device 10 which has the second electrode 130 formed therein serves as a light-shielding region 102. The light-transmitting region 104 is provided between the light-shielding regions 102 next to each other (that is, between the light-emitting units 140 next to each other). The light-transmitting region 104 is a region in which the second electrode 130 is not provided. However, in a case where the organic layer 120 has optical transparency, the light-transmitting region 104 may be provided with the organic layer 120.

The end of a portion of the second electrode 130 which is located outside the light-emitting unit 140, for example, the end of a portion of the second electrode 130 which is located over the insulating layer 150, serves as an oxidized portion 136. The oxidized portion 136 is a portion of the second electrode 130 which is oxidized. For example, in a case where the second electrode 130 is formed of aluminum or an aluminum alloy, the oxidized portion 136 includes an aluminum oxide. The visible light transmittance in the oxidized portion 136 is higher than the visible light transmittance in the rest of the second electrode 130.

Figure 3:
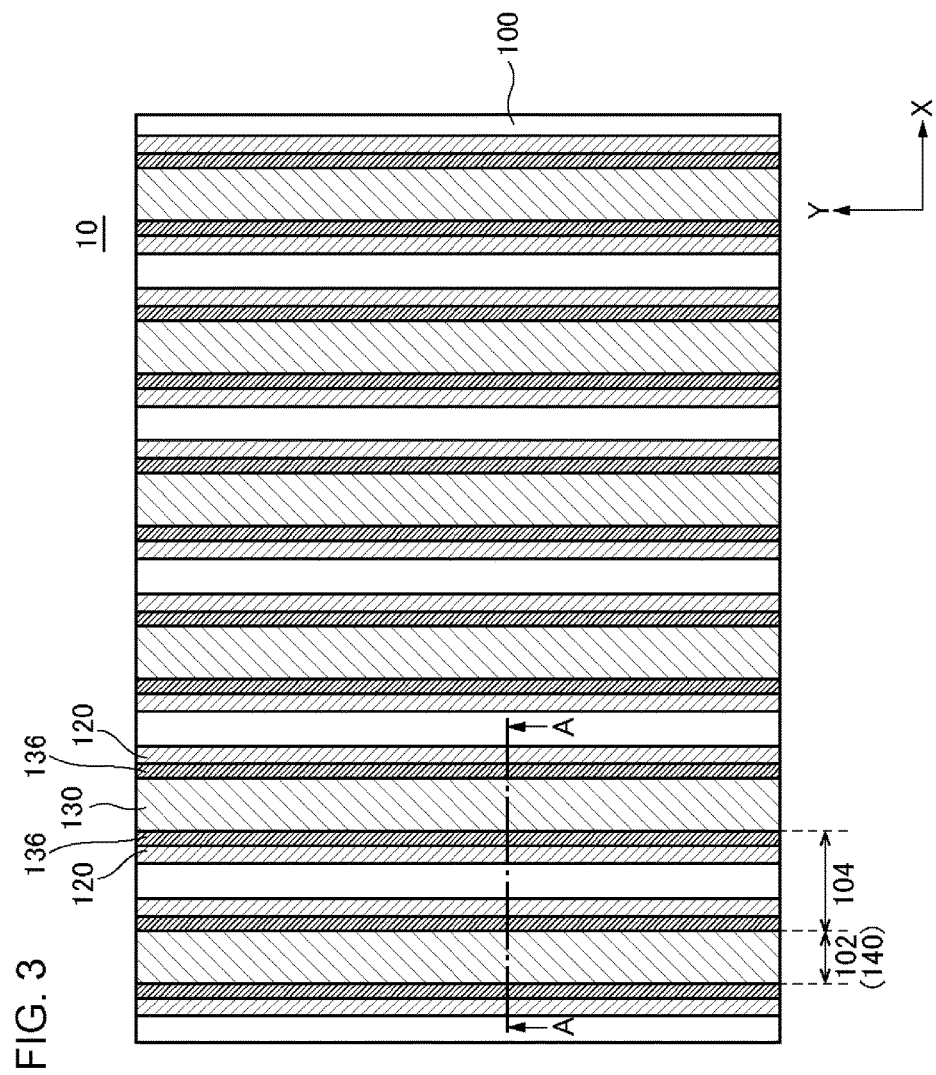
FIG. 3 is a plan view of the light-emitting device.

FIG. 3 is a plan view of the light-emitting device 10. Meanwhile, FIG. 1 corresponds to a cross-section A-A of FIG. 3. In the example shown in the drawing, the light-shielding region 102, the light-emitting unit 140, and the light-transmitting region 104 extend linearly (in a Y direction in FIG. 3). The light-shielding region 102 and the light-transmitting region 104 are alternately repeatedly provided in a direction (X direction in FIG. 3) orthogonal to the extending direction of the light-emitting unit 140.

Meanwhile, the light-transmitting region 104 is preferably provided in every region between the light-emitting units 140 next to each other. However, the light-transmitting region 104 is not required to be provided in any region between the light-emitting units 140.

Figure 4:
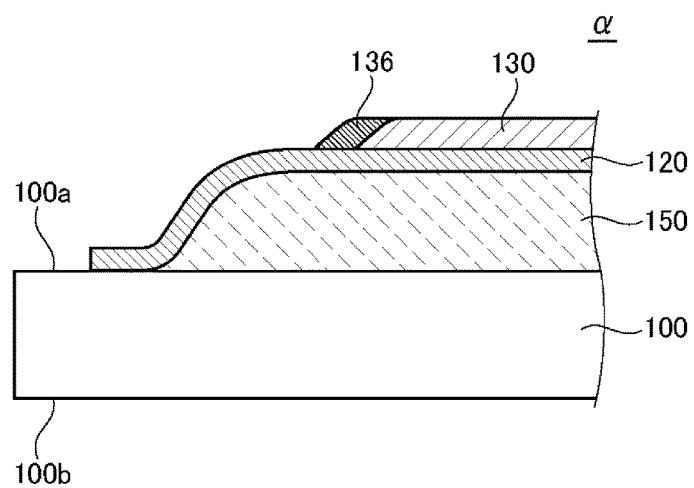
FIG. 4 is an enlarged view of a region surrounded by a dotted line α of FIG. 2.

FIG. 4 is an enlarged view of a region surrounded by a dotted line α of FIG. 2. As shown in the drawing, the lateral side of the insulating layer 150 is gently inclined, and the organic layer 120 is formed along the inclined plane. The second electrode 130 and the oxidized portion 136 are located over the upper surface of the insulating layer 150. The oxidized portion 136 (that is, the end of the second electrode 130) is thinner than the rest of the second electrode 130, gradually thinning toward the end.

Meanwhile, an unoxidized portion of the second electrode 130 may remain below the oxidized portion 136 in the thickness direction of the second electrode 130. For example, in the example shown in FIG. 4, the end of the oxidized portion 136 toward the center of the second electrode 130 is only at the surface layer of the second electrode 130 in the thickness direction.

Next, a method of manufacturing the light-emitting device 10 will be described. First, the first electrode 110 is formed on the substrate 100 by, for example, sputtering. Then, the first electrode 110 is formed in a predetermined pattern by, for example, photolithography. The insulating layer 150 is then formed over the edge of the first electrode 110. For example, in a case where the insulating layer 150 is formed of a photosensitive resin, the insulating layer 150 is formed in a predetermined pattern by undergoing exposure and development steps. Next, the organic layer 120 is formed. Each layer of the organic layer 120 may be formed by vapor deposition, and may be formed by a coating method.

Thereafter, the second electrode 130 is formed on the organic layer 120. The second electrode 130 is formed by, for example, vapor deposition using a mask. At this time, a vapor deposition material leaks out from a gap between the substrate 100 and the mask, causing the end of the second electrode 130 to spread toward the outer side of the second electrode 130. Thereby, the second electrode 130 may become wider than a design value. The end of the second electrode 130 becomes thinner than the rest of the second electrode 130.

Next, the end of a portion of the second electrode 130 which is located outside the light-emitting unit 140 is oxidized. Thereby, the oxidized portion 136 is formed. Such oxidation treatment is performed, for example, by irradiating the end of the second electrode 130 with a laser beam in an oxidizing atmosphere such as an atmosphere including oxygen.

Thereafter, the light-emitting unit 140 is sealed using a sealing member (not shown).

As stated above, according to the first embodiment, the end of the second electrode 130 is oxidized and serves as the oxidized portion 136. The oxidized portion 136 is higher in the visible light transmittance than the second electrode 130. Therefore, even in a case where the end of the second electrode 130 spreads outward of the second electrode 130, and the second electrode 130 becomes wider than a design value, it is possible to prevent the light-transmitting region 104 from narrowing.

Modification Example 1

Figure 5:
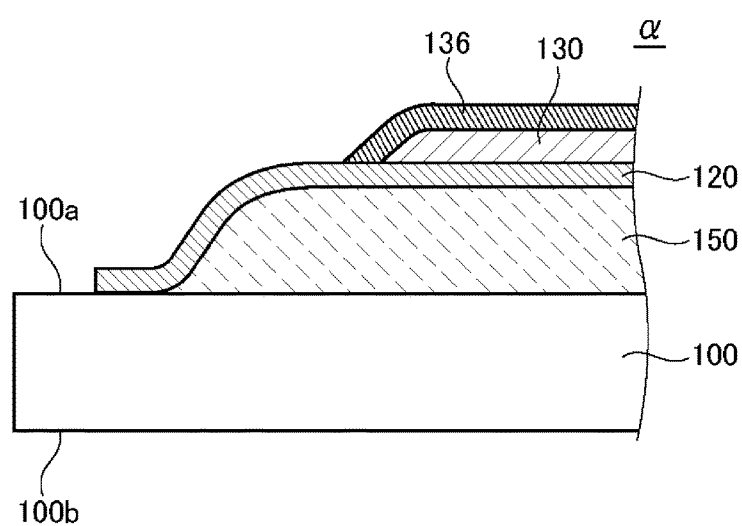
FIG. 5 is a cross-sectional view illustrating a main part of a light-emitting device according to Modification Example 1.

FIG. 5 is a cross-sectional view illustrating a main part of a light-emitting device 10 according to Modification Example 1, and corresponds to FIG. 4 in the first embodiment. The light-emitting device 10 according to the present modification example has the same configuration as that of the light-emitting device 10 according to the first embodiment, except that the oxidized portion 136 is formed over the entire surface of the second electrode 130.

Specifically, the oxidized portion 136 is formed by treating the surface layer of the second electrode 130 in an oxidizing atmosphere. At this time, a region of the second electrode 130 from the surface to a certain depth is oxidized. Here, the end of the second electrode 130 is thinner than other regions of the second electrode 130. For this reason, when seen in the thickness direction, the entire end of the second electrode 130 appears as the oxidized portion 136. On the other hand, the rest of the second electrode 130 is configured such that only the surface layer serves as the oxidized portion 136 and at least the lower layer remains a metal layer as it is. For this reason, the second electrode 130 is not increased in resistance. Alternatively, since the oxidation of the oxidized portion 136 may be treated collectively, it is possible to contribute to the simplification of the process.

Meanwhile, the above-described oxidizing atmosphere contains, for example, at least one of $O_2$, $N_2O$, $H_2O_2$, and $O_3$.

In the present modification example also, the end of the second electrode 130 is oxidized to serve as the oxidized portion 136. Therefore, as is the case with the first embodiment, even in a case where the end of the second electrode 130 spreads toward the outer side of the second electrode 130, and the second electrode 130 becomes wider than a design value, it is possible to prevent the light-transmitting region 104 from narrowing.

In addition, when the second electrode 130 is irradiated over its entire surface with a laser beam instead of being treated in an oxidizing atmosphere, a structure shown in FIG. 5 is obtained. In this case, since the laser irradiation position is not required to be strictly controlled as compared to the embodiment, it is possible to simplify the process of manufacturing the light-emitting device 10.

Modification Example 2

Figure 6:
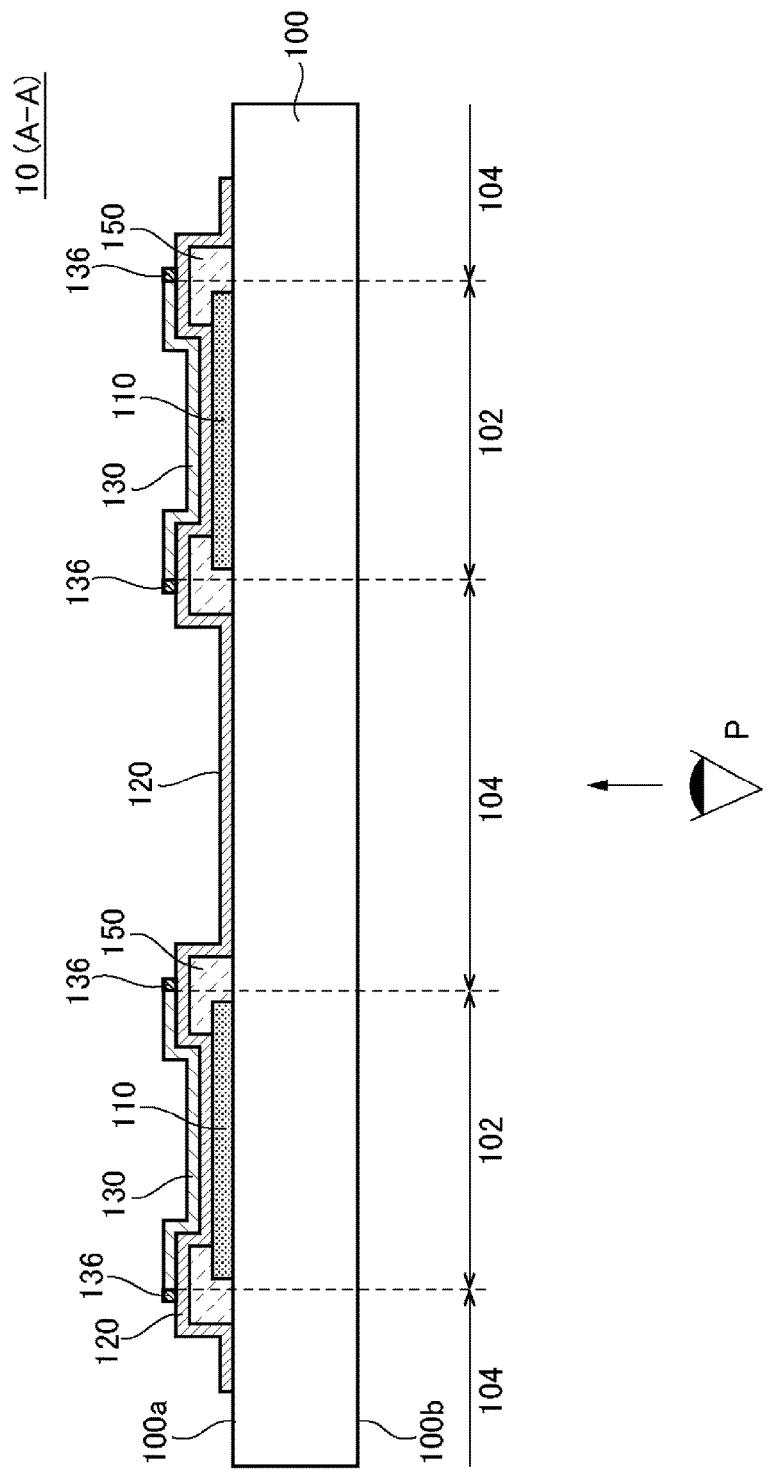
FIG. 6 is a cross-sectional view illustrating a configuration of a light-emitting device according to Modification Example 2.

FIG. 6 is a cross-sectional view illustrating a configuration of a light-emitting device 10 according to Modification Example 2, and corresponds to FIG. 1 in the first embodiment. The light-emitting device 10 according to the present modification example has the same configuration as that of the light-emitting device 10 according to the first embodiment or Modification Example 1, except that the organic layer 120 is formed even in the light-transmitting region 104.

In the present modification example also, the end of the second electrode 130 is oxidized to serve as the oxidized portion 136. Therefore, as is the case with the first embodiment, it is possible to prevent the light-transmitting region 104 from narrowing. In addition, since the organic layer 120 is also formed in the light-transmitting region 104, the organic layer 120 may be continuously formed in a plurality of light-shielding regions 102 and a plurality of light-transmitting regions 104. Therefore, since the organic layer 120 does not require patterning, it is possible to reduce manufacturing costs of the light-emitting device 10.

Modification Example 3

Figure 7:
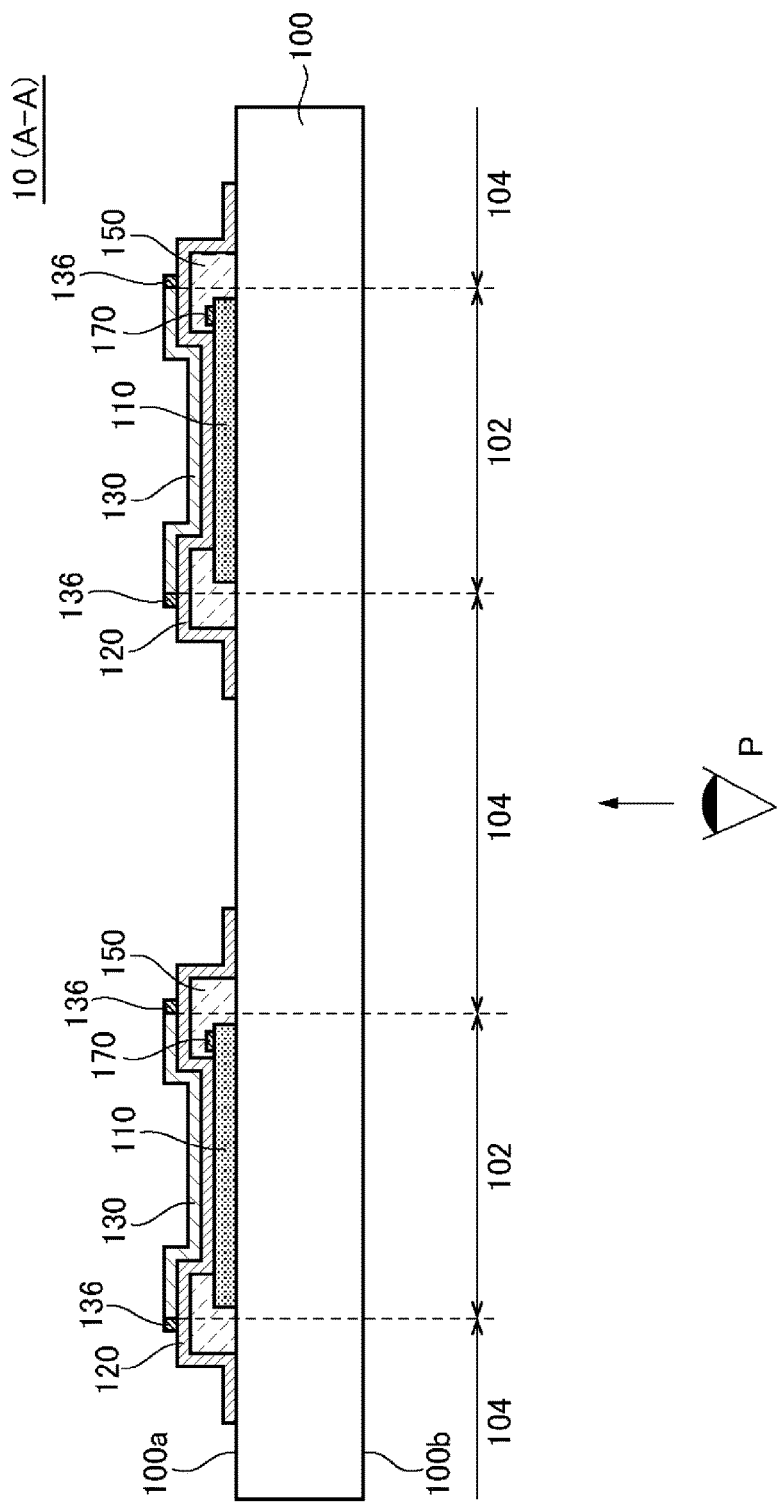
FIG. 7 is a cross-sectional view illustrating a configuration of a light-emitting device according to Modification Example 3.

FIG. 7 is a cross-sectional view illustrating a configuration of a light-emitting device 10 according to Modification Example 3, and corresponds to FIG. 1 in the first embodiment. The light-emitting device 10 according to the present modification example has the same configuration as that of the light-emitting device 10 according to the first embodiment or Modification Examples 1 or 2, except that a conductive portion 170 is included.

The conductive portion 170 is, for example, an auxiliary electrode of the first electrode 110 and is in contact with the first electrode 110. In the example shown in the drawing, the conductive portion 170 is formed on the first electrode 110. The conductive portion 170 is formed of a material having a lower resistance value than that of the first electrode 110, and is formed using, for example, at least one metal layer. The conductive portion 170 has, for example, a configuration in which a first metal layer of Mo, a Mo alloy or the like, a second metal layer of Al, an Al alloy or the like, and a third metal layer of Mo, a Mo alloy or the like are laminated in this order. The second metal layer out of these three metal layers is the thickest. The conductive portion 170 is covered with the insulating layer 150. For this reason, the conductive portion 170 is not directly connected to any of the organic layer 120 and the second electrode 130.

A method of manufacturing the light-emitting device 10 according to the present modification example has the same configuration as that of the light-emitting device 10 according to the first embodiment, except that the conductive portion 170 is formed after the formation of the first electrode 110 and before the formation of the insulating layer 150. The conductive portion 170 is formed, for example, by forming a film serving as the conductive portion 170 using sputtering or vapor deposition, and then patterning the film using lithography. However, the conductive portion 170 may also be formed by sputtering using a mask.

In also the present modification example, the end of the second electrode 130 is oxidized to serve as the oxidized portion 136. Therefore, as is the case with the first embodiment, it is possible to prevent the light-transmitting region 104 from narrowing. In addition, since the conductive portion 170 is formed, it is possible to lower the apparent resistance of the first electrode 110.

Second Embodiment

Figure 8:
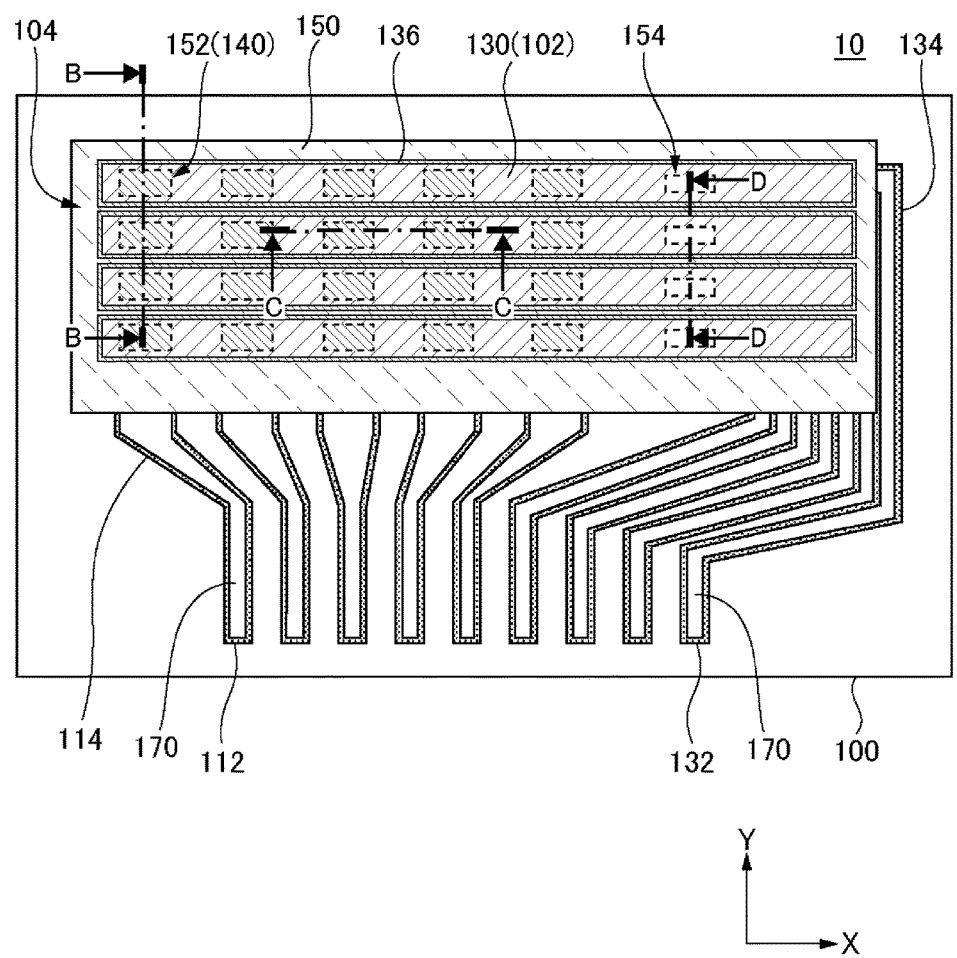
FIG. 8 is a plan view of a light-emitting device according to a second embodiment.
Figure 9:
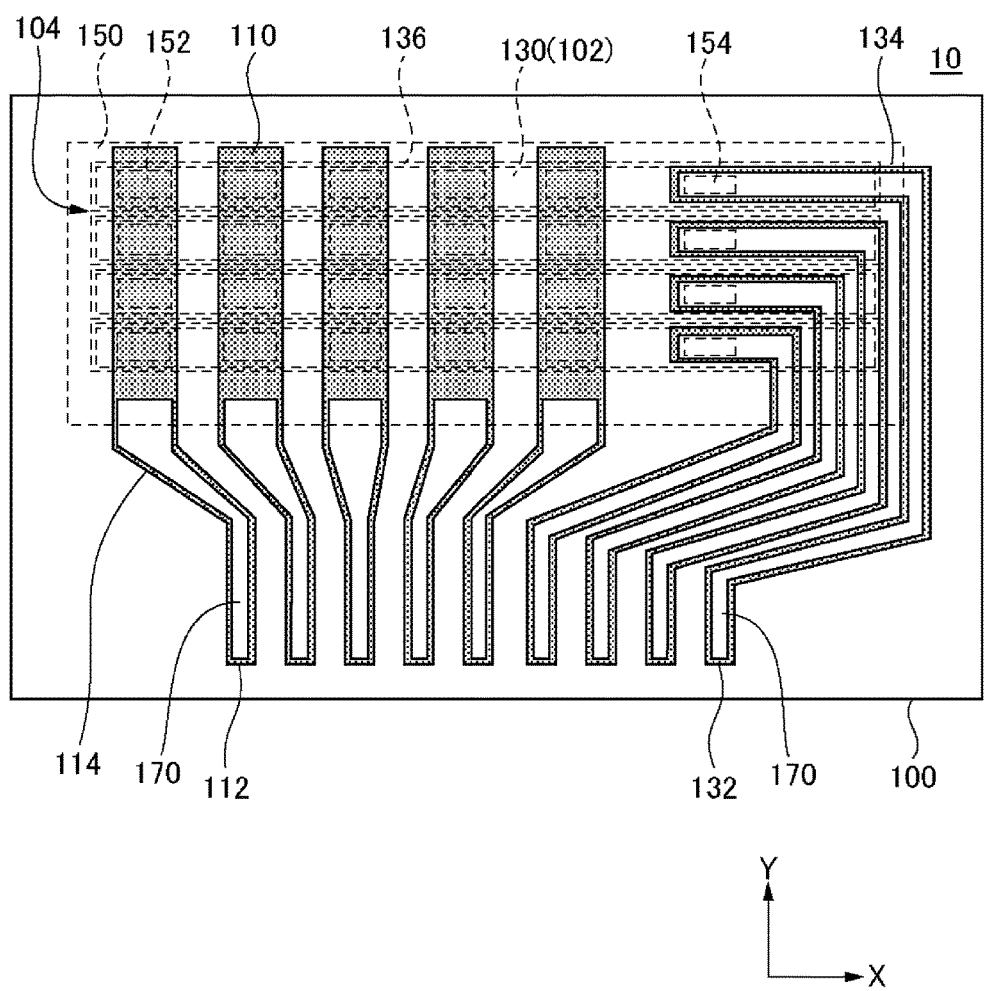
FIG. 9 is a diagram in which a second electrode, an organic layer, and an insulating layer are removed from FIG. 8.
Figure 10:
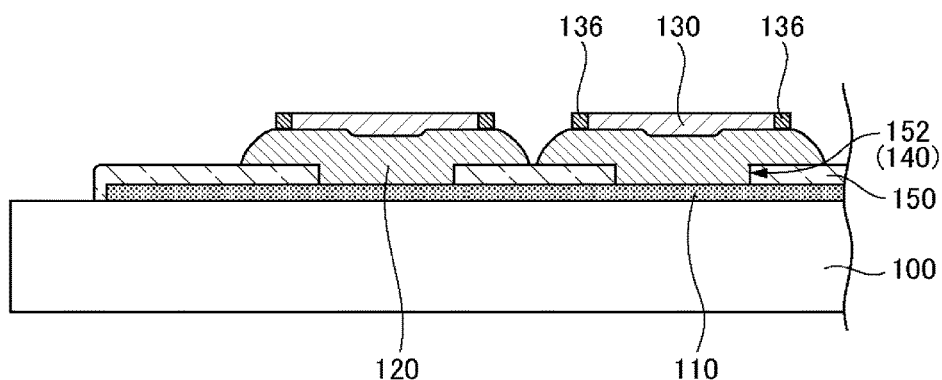
FIG. 10 is a cross-sectional view taken along line B-B of FIG. 8.
Figure 11:
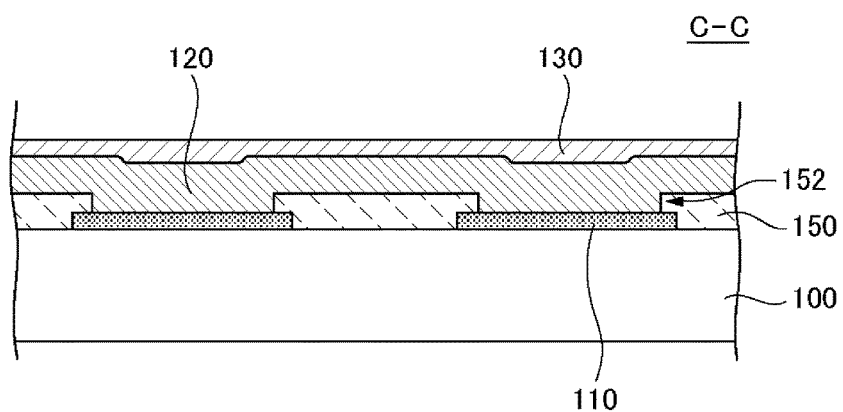
FIG. 11 is a cross-sectional view taken along line C-C of FIG. 8.
Figure 12:
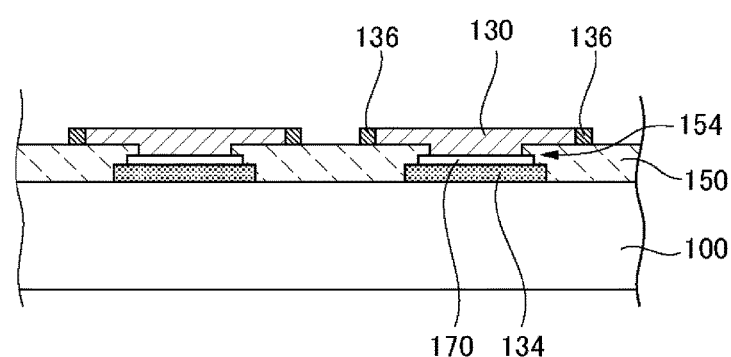
FIG. 12 is a cross-sectional view taken along line D-D of FIG. 8.

FIG. 8 is a plan view of a light-emitting device 10 according to a second embodiment. FIG. 9 is a diagram in which the second electrode 130, the organic layer 120, and the insulating layer 150 are removed from FIG. 8. FIG. 10 is a cross-sectional view taken along line B-B of FIG. 8, FIG. 11 is a cross-sectional view taken along line C-C of FIG. 8, and FIG. 12 is a cross-sectional view taken along line D-D of FIG. 8.

The light-emitting device 10 according to the present embodiment is a display, and includes a substrate 100, a plurality of first electrodes 110, a light-emitting unit 140, an insulating layer 150, a plurality of openings 152, a plurality of openings 154, a plurality of extraction interconnects 114, an organic layer 120, a plurality of second electrodes 130, and a plurality of extraction interconnects 134.

The first electrode 110 linearly extends in a first direction (Y direction in FIG. 9). The end of the first electrode 110 is connected to the extraction interconnect 114.

The extraction interconnect 114 is an interconnect for connecting the first electrode 110 to a first terminal 112. In the example shown in the drawing, one end side of the extraction interconnect 114 is connected to the first electrode 110, and the other end side of the extraction interconnect 114 serves as the first terminal 112. In the example shown in the drawing, the first electrode 110 and the extraction interconnect 114 are formed integrally with each other. The conductive portion 170 is formed on the extraction interconnect 114. The configuration of the conductive portion 170 is the same as that in Modification Example 3. Meanwhile, a portion of the extraction interconnect 114 is covered with the insulating layer 150.

As shown in FIG. 8 and FIGS. 10 to 12, the insulating layer 150 is formed on the plurality of first electrodes 110 and in regions located therebetween. The plurality of openings 152 and the plurality of openings 154 are formed in the insulating layer 150. The plurality of second electrodes 130 extend in parallel to each other in a direction intersecting the first electrode 110 (for example, a direction orthogonal to: X direction in FIG. 8). The opening 152 is located at the point of intersection of the first electrode 110 and the second electrode 130 when seen in a plan view. Specifically, the plurality of openings 152 are aligned in a direction in which the first electrode 110 extends (Y direction in FIG. 8). In addition, the plurality of openings 152 are also aligned in a direction in which the second electrode 130 extends (X direction in FIG. 8). Therefore, the plurality of openings 152 are disposed so as to constitute a matrix.

The opening 154 is located in a region overlapping one end side of each of the plurality of second electrodes 130 when seen in a plan view. In addition, the opening 154 is disposed along one side of the matrix which is constituted by the openings 152. When seen in a direction along this one side (for example, Y direction in FIG. 8, that is, a direction along the first electrode 110), the openings 154 are disposed at a predetermined interval. A portion of the extraction interconnect 134 is exposed from the opening 154. The extraction interconnect 134 is connected to the second electrode 130 through the opening 154.

The extraction interconnect 134 is an interconnect for connecting the second electrode 130 to a second terminal 132, and includes a layer constituted of the same material as that of the first electrode 110. One end side of the extraction interconnect 134 is located below the opening 154, and the other end side of the extraction interconnect 134 is extracted to the outside of the insulating layer 150. In the examples shown in the drawings, the other end side of the extraction interconnect 134 serves as the second terminal 132. The conductive portion 170 is formed on the extraction interconnect 134. The configuration of the conductive portion 170 is the same as that in Modification Example 3. Meanwhile, a portion of the extraction interconnect 134 is covered with the insulating layer 150.

The organic layer 120 is formed in a region overlapping the opening 152. A hole injection layer of the organic layer 120 is in contact with the first electrode 110, and an electron injection layer of the organic layer 120 is in contact with the second electrode 130. Therefore, the light-emitting unit 140 is located in each region overlapping the opening 152.

The edge of the second electrode 130 is oxidized to serve as the oxidized portion 136. The details of the oxidized portion 136 areas shown in the embodiment. As is the case with the embodiment, a portion between the second electrodes 130 next to each other serves as the light-transmitting region 104, and a region overlapping the second electrode 130 serves as the light-shielding region 102.

A method of manufacturing the light-emitting device 10 according to the present embodiment is the same as the method of manufacturing the light-emitting device 10 according to Modification Example 3.

In the present embodiment also, the end of the second electrode 130 is oxidized to serve as the oxidized portion 136. Therefore, as is the case with the first embodiment, it is possible to prevent the light-transmitting region 104 from narrowing.

Third Embodiment

Figure 13:
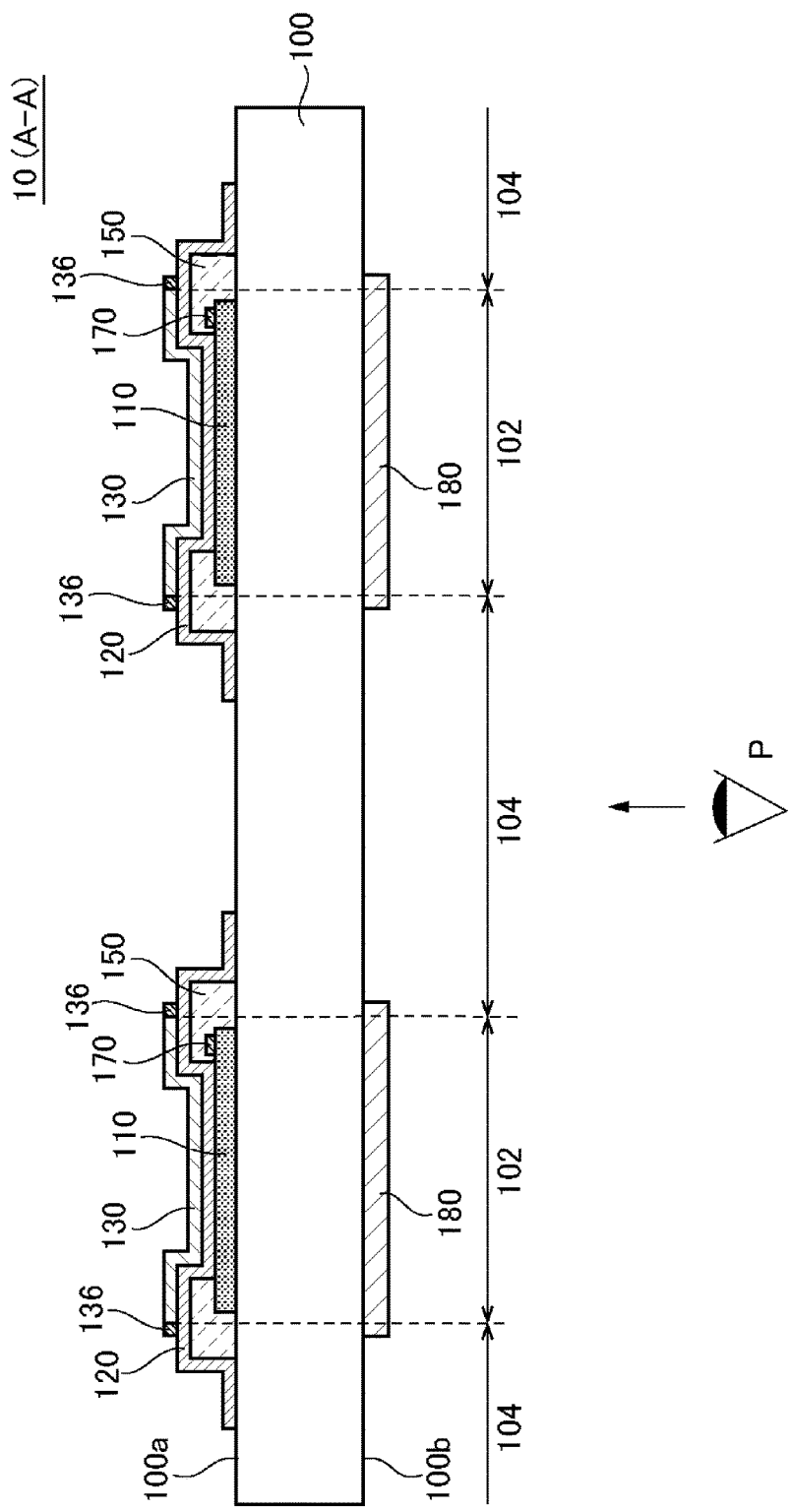
FIG. 13 is a cross-sectional view illustrating a configuration of a light-emitting device according to a third embodiment.

FIG. 13 is a cross-sectional view illustrating a configuration of a light-emitting device 10 according to a third embodiment, and corresponds to FIG. 1 in the first embodiment. The light-emitting device 10 according to the present embodiment has the same configuration as that of any of each embodiment and each modification example described above, except that a light scattering layer 180 is included. The drawing shows the same case as that in Modification Example 3.

The light scattering layer 180 is provided on the second surface 100b of the substrate 100. The light scattering layer 180 overlaps at least the end (oxidized portion 136) of the second electrode 130. In the example shown in the drawing, the light scattering layer overlaps the entirety of the second electrode 130. The end of the light scattering layer 180 overlaps a portion of the second electrode 130 which is located on the insulating layer 150. That is, most of light scattering layer 180 does not overlap the light-transmitting region 104. Meanwhile, the entirety of the light scattering layer 180 is not required to overlap the light-transmitting region 104. In example shown in the drawing, the light scattering layer 180 also overlaps the light-emitting unit 140. However, the light scattering layer 180 is not required to overlap the light-emitting unit 140.

Figure 14:
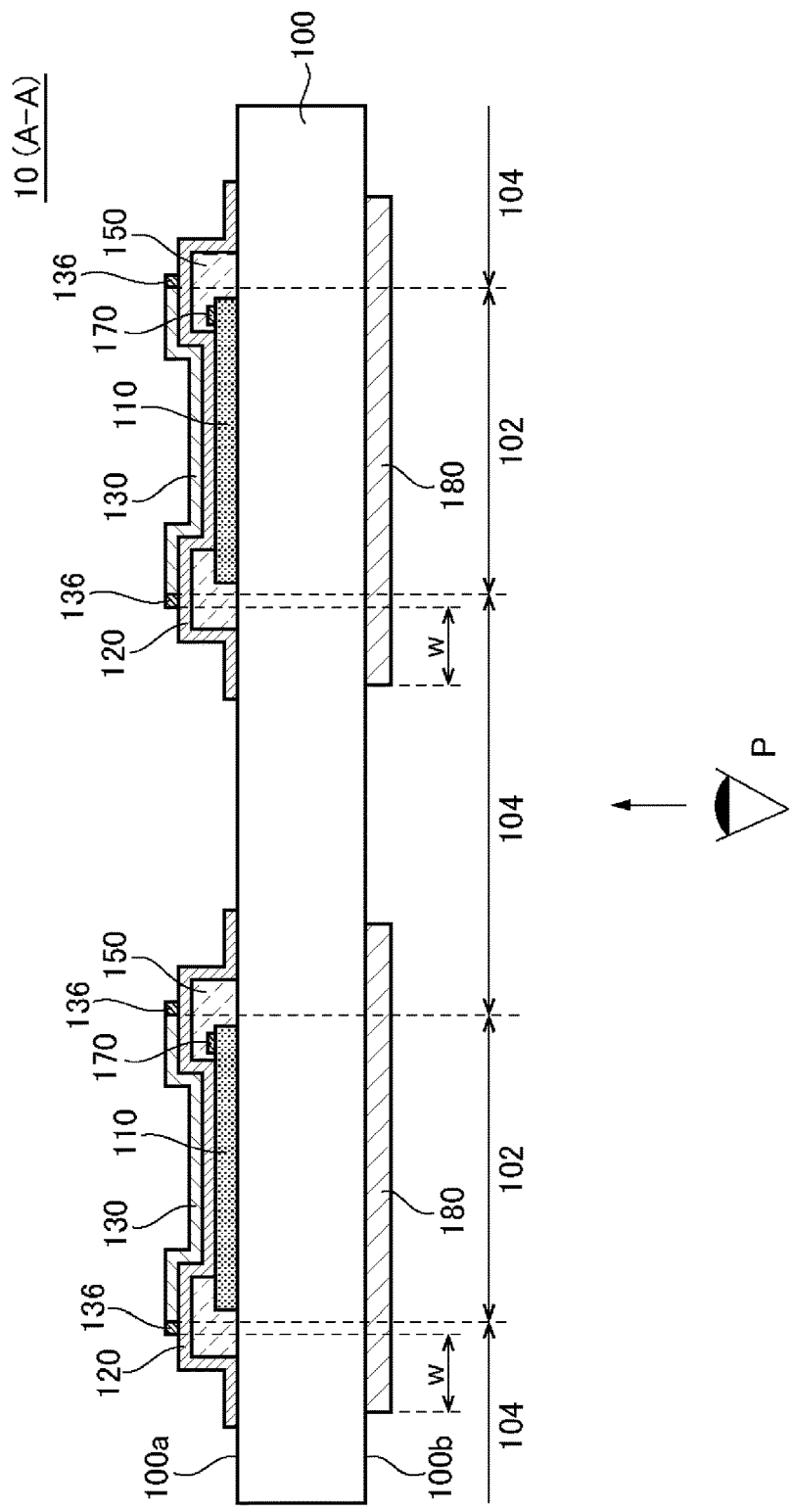
FIG. 14 is a cross-sectional view illustrating a modification example of FIG. 13.

Meanwhile, as shown in FIG. 14, the end of the light scattering layer 180 may be located in a portion of the light-transmitting region 104 which is close to the light-shielding region 102. In this case, a distance w from the end of the light scattering layer 180 to the end of the second electrode 130 is, for example, preferably equal to or less than 10% of the light-transmitting region 104.

The light scattering layer 180 contains a binder (base material) constituted of an organic material or an inorganic material mixed with multiple particles. However, the configuration of the light scattering layer 180 is not limited thereto.

The binder (base material) of the light scattering layer 180 may be, for example, an imide-based, acrylic-based, ether-based, silane-based, or siloxane-based organic material, and may be an inorganic material such as glass paste, glass frit, or $SiO_2$ sol. The refractive index of the binder in the light scattering layer 180 is, for example, equal to or greater than 1.2 and equal to or less than 2.2, and is preferably equal to or greater than 1.6 and equal to or less than 1.9.

The particle of the light scattering layer 180 is constituted of, for example, an inorganic material. A material constituting the particle is an oxide such as, for example, a titanium oxide, a zirconium oxide, or a silicon oxide. The diameter of the particle, for example, the average value of sphere-equivalent diameters (diameters) is, for example, equal to or greater than 100 nm and equal to or less than 5 µm, but is not limited to this range. The particle has either optical transparency or light reflectivity. In a case where the particle has optical transparency, the refractive index of the particle is different from the refractive index of a binder of an adhesive layer 200 described later.

The volume ratio of the particles to the entire light scattering layer 180 is, for example, equal to or greater than 20% and equal to or less than 50%. This volume ratio can be defined by the area occupying ratio of the particles to the light scattering layer 180, for example, on the cross-section of the substrate 100 in its thickness direction. The refractive index of the light scattering layer 180 can be adjusted by adjusting the material of the particles and the volume ratio of the particles (that is, the content rate of the particles of the light scattering layer 180).

In also the present embodiment, the end of the second electrode 130 is oxidized to serve as the oxidized portion 136. Therefore, as is the case with the first embodiment, it is possible to prevent the light-transmitting region 104 from narrowing. In addition, the light scattering layer 180 overlaps the oxidized portion 136 of the second electrode 130. Therefore, the oxidized portion 136 of the second electrode 130 can be made less conspicuous. In addition, in a case where the light scattering layer 180 overlaps the light-emitting unit 140, the light extraction efficiency of the light-emitting device 10 is improved.

Example 1

Figure 15:
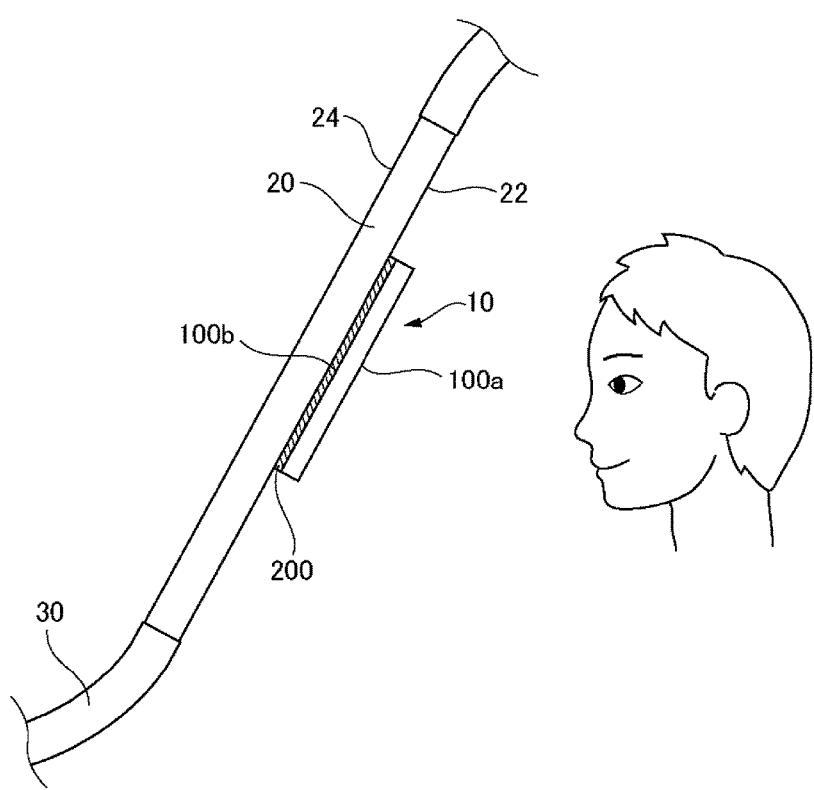
FIG. 15 is a cross-sectional view illustrating a configuration of a light-emitting system according to Example 1.

FIG. 15 is a cross-sectional view illustrating a configuration of a light-emitting system according to Example 1. This light-emitting system includes a light-emitting device 10 and a partition member 20. The partition member 20 has optical transparency, and partitions an interior space from the exterior thereof. This space is, for example, a space occupied by a person, or a space having objects such as commercial products disposed therein. The light-emitting device 10 has the same configuration as that of any of the embodiments and the modification examples described above. In the example shown in the drawing, a surface (first surface 100a) of the substrate 100 on which the light-emitting unit 140 is provided is directed toward a space occupied by a person.

The partition member 20 is, for example, a window of a mobile object 30 for transporting a person, or a window of a showcase, and is formed using glass or a light-transmitting resin. The mobile object 30 is, for example, an automobile, a train, or an airplane. In a case where the mobile object 30 is an automobile, the partition member 20 is a windshield, a rear windshield, or a side window (for example, door window) installed at the side of the seat. In a case where the partition member 20 is a rear windshield, a plurality of light-emitting units 140 function as, for example, a brake light. In addition, in a case where the partition member 20 is a windshield or a rear windshield, the plurality of light-emitting units 140 may be a turn signal light. In addition, the partition member 20 may be a window for partitioning the interior and the exterior of a room such as a meeting room. The partition member may be a light-emitting system allowing identification of whether or not the meeting room is occupied, depending on the lighting/non-lighting of the light-emitting unit 140.

The second surface 100b of the light-emitting device 10, that is, the surface on the light extraction side is fixed to the inner surface (first surface 22) of the partition member 20 with the adhesive layer 200 interposed therebetween. Therefore, light which is radiated from the light-emitting unit 140 of the light-emitting device 10 is radiated to the exterior of the aforementioned space (for example, mobile object 30) through the partition member 20. Moreover, the light-emitting device 10 has optical transparency. Therefore, a person can view the exterior or interior of the space through the partition member 20. For example, a person who is inside the mobile object 30 is able to view the exterior of the mobile object 30 through the partition member 20. Meanwhile, the entirety of the second surface 100b of the substrate 100 may be fixed to the first surface 22 of the partition member 20 with the adhesive layer 200 interposed therebetween, or a portion (for example, two sides facing each other) of the second surface 100b may be fixed to the first surface 22 of the partition member 20.

The adhesive layer 200 fixes the light-emitting device 10 to the partition member 20. Insofar as a material fulfilling such a function is used, there is no particular limitation to the material of the adhesive layer 200. In addition, in a case where the refractive index of the partition member 20 and the refractive index of the substrate 100 of the light-emitting device 10 are substantially the same as each other such as, for example, a case where both the partition member 20 and the substrate 100 are formed of glass, a material having a refractive index the same as or close to those of the both is used in the adhesive layer 200. In addition, in a case where the partition member 20 and the substrate 100 are different from each other in refractive indexes (for example, the partition member 20 is formed of plastic, and the substrate 100 is formed of glass), the refractive index of the adhesive layer 200 is preferably a numerical value between the refractive index of the partition member 20 and the refractive index of the substrate 100. With such a configuration, light emitted from the light-emitting device 10 can be efficiently extracted to the outside through the partition member 20. In addition, the light-emitting device 10 and the partition member 20 are preferably bonded to each other without any gaps therebetween. This is because, in a case where a gap is present therebetween, light emitted from the light-emitting device 10 is reflected by the partition member 20, and the reflected light is transmitted to the interior through the light-transmitting region 104 of the light-emitting device 10.

The light-emitting device 10 has a configuration shown in any of the embodiments and each modification example. Therefore, it is possible to prevent the light-transmitting region 104 of the light-emitting device 10 from narrowing. In addition, when the visible light transmittance of the oxidized portion 136 of the second electrode 130 is equal to or less than 90%, even if a portion of light from the light-emitting unit 140 is scattered or reflected, it is possible to prevent the scattered light or the reflected light from being radiated to the opposite side of the substrate 100 (for example, to the interior of the mobile object 30).

Example 2

Figure 16:
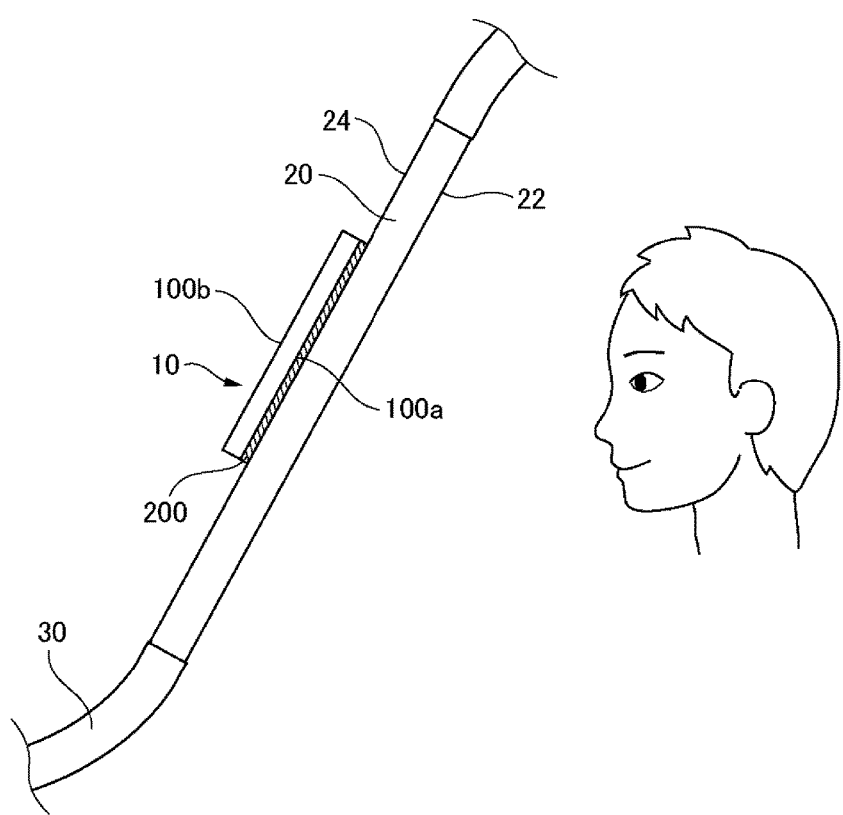
FIG. 16 is a cross-sectional view illustrating a configuration of a light-emitting system according to Example 2.

FIG. 16 is a cross-sectional view illustrating a configuration of a light-emitting system according to Example 2. The light-emitting system according to the present example has the same configuration as that of the light-emitting system according to Example 1, except that the light-emitting device 10 is installed on a surface (second surface 24) of the partition member 20 located on the exterior of the mobile object 30.

The light-emitting device 10 according to the present example has the same configuration as that in any of the embodiments and each modification example described above. However, the light-emitting device 10 is configured such that a surface not facing the partition member 20 serves as the light extraction surface. In order to achieve the above configuration, the surface of the light-emitting device 10 on the first surface 100a side may be made to face the partition member 20.

In the present example, as is the case with Example 1, it is possible to prevent the light-transmitting region 104 of the light-emitting device 10 from narrowing.

In addition, light from the light-emitting device 10 is radiated directly to the outside of the mobile object 30 without passing through the partition member 20. Therefore, a person who is outside the mobile object 30 may more easily recognize light from the light-emitting device 10 than in Example 1. In addition, since the light-emitting device 10 is installed on the exterior of the mobile object 30, that is, on the second surface 24 side of the partition member 20, it is possible to prevent light from the light-emitting device 10 from being reflected by the partition member 20 and entering the interior of the mobile object 30.

Example 3

Figure 17:
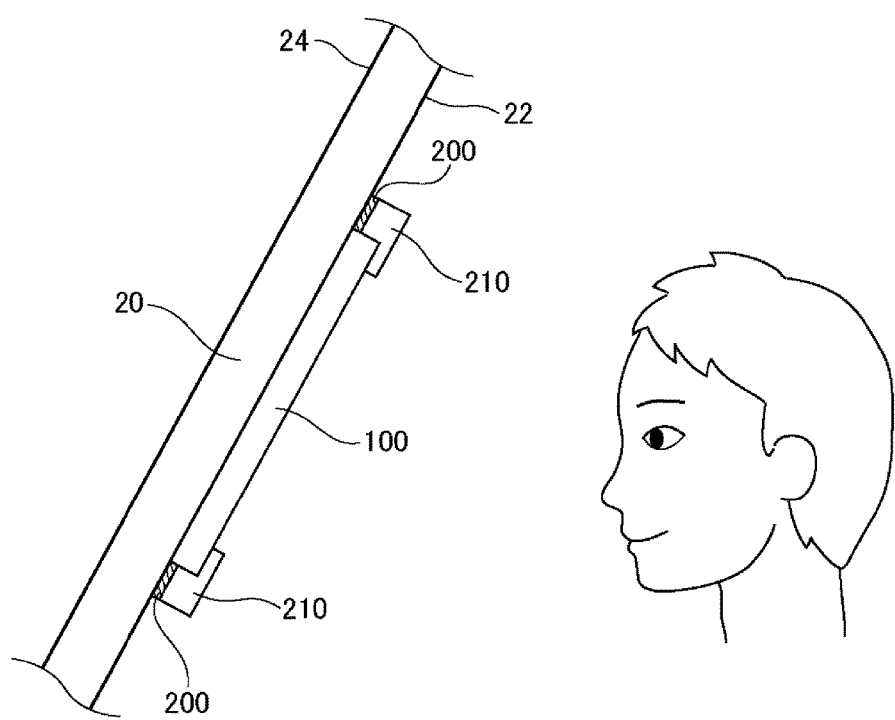
FIG. 17 is a cross-sectional view illustrating a configuration of a light-emitting system according to Example 3.

FIG. 17 is a cross-sectional view illustrating a configuration of a light-emitting system according to Example 3.

The light-emitting system according to the present example has the same configuration as that of the light-emitting system according to Example 1, except that the light-emitting device 10 is fixed to the partition member 20 using fixing members 210.

The fixing member 210 is a frame-like member with the lower surface thereof fixed to the partition member 20 using an adhesive layer 200. The upper portion of the fixing member 210 is bent inward, the bent portion holding the edge of the light-emitting device 10. However, the shape of the fixing member 210 is not limited to the example shown in the drawing.

In the present example, as is the case with Example 1, it is possible to prevent the light-transmitting region 104 of the light-emitting device 10 from narrowing.

Figure 18:
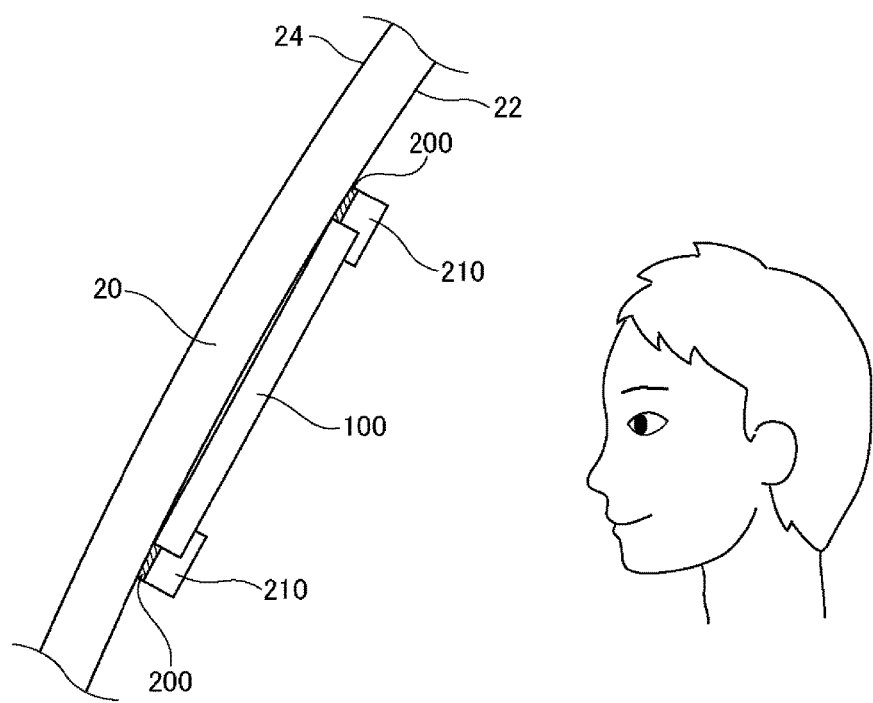
FIG. 18 is a cross-sectional view illustrating a modification example of FIG. 17.

In addition, as shown in FIG. 18, the mobile object 30 may be projected outward and the partitioning member 20 may be curved along the projecting direction of the mobile object 30. In such a case, it is difficult to fix the flat plate-shaped light-emitting device 10 directly to the inner surface (first surface 22) of the partition member 20. However, the use of the fixing member 210 allows the light-emitting device 10 to be fixed to the first surface 22 of the partition member 20 even in such circumstances.

In a case where the curved partition member 20 and the flat plate-shaped light-emitting device 10 are fixed to each other in the above manner, a filler may be filled into a gap between the partition member 20 and the light-emitting device 10. As described above, if there is a gap present therebetween, light emitted from the light-emitting device 10 is reflected by the partition member 20, and the reflected light is transmitted to the interior through the light-transmitting region 104 of the light-emitting device 10. When the refractive index of the partition member 20 and the refractive index of the substrate 100 of the light-emitting device 10 are substantially the same as each other (for example, when both are formed of glass), the refractive index of the filling member is preferably a value which is the same as or close to these refractive indexes. In addition, when the partition member 20 and the substrate 100 are different from each other in refractive indexes (for example, the partition member 20 is formed of plastic while the substrate 100 is formed glass), the refractive index of the filler is preferably a numerical value between the refractive index of the partition member 20 and the refractive index of the substrate 100 of the light-emitting device 10.

Example 4

Figure 19:
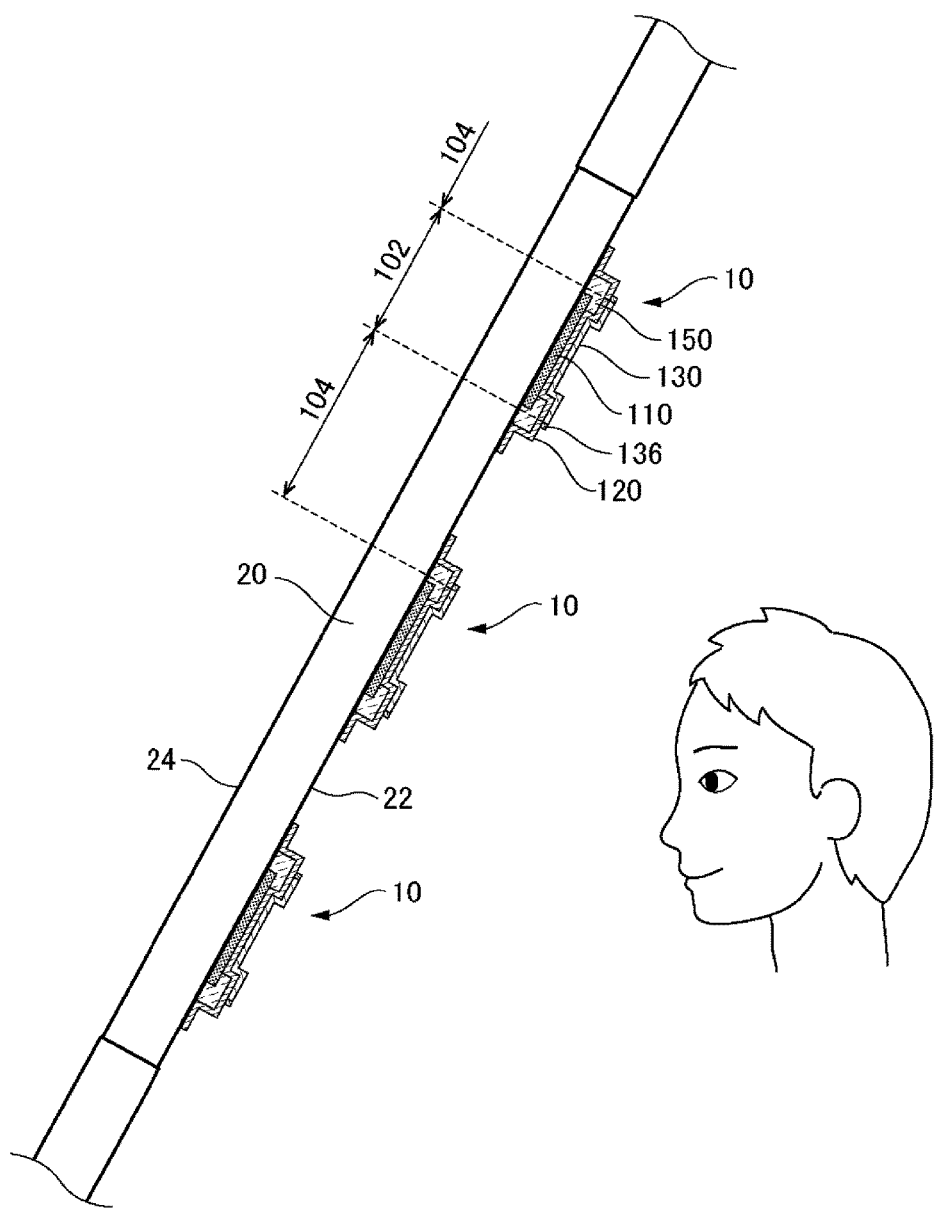
FIG. 19 is a cross-sectional view illustrating a configuration of a light-emitting system according to Example 4.

FIG. 19 is a cross-sectional view illustrating a configuration of a light-emitting system according to Example 4. The light-emitting system according to the present example has the same configuration as that of the light-emitting system according to Example 1, except that the light-emitting unit 140 is formed on the first surface 22 or the second surface 24 of the partition member 20. In other words, in the present example, the partition member 20 also serves as the substrate 100 in Example 1.

Meanwhile, in the present example, a concave portion is formed in the surface of the partition member 20 on which the light-emitting unit 140 is formed, and the light-emitting unit 140 may be formed within this concave portion. For example, one concave portion may be formed in a region in which a plurality of light-emitting units 140 are formed, and the plurality of light-emitting units 140 may be formed on the bottom surface of the concave portion; and a concave portion may be individually formed for each of the plurality of light-emitting units 140. In this case, sealing of the light-emitting unit 140 may be configured to seal the plurality of concave portions at a time using, for example, film sealing or the like with high optical transparency. The light-emitting unit 140 may be prevented from protruding from the partition member 20 in either cases of an individual concave portion being formed for each light emitting unit 140 or one concave portion being formed for plural light emitting units 140. Meanwhile, when the light-emitting unit 140 is formed in the concave portion of the partition member 20, the upper portion of the light-emitting unit 140 may protrude from the first surface 22 (or the second surface 24) of the partition member 20, or the entirety of the light-emitting unit 140 may be located below the first surface 22 (or the second surface 24).

In the present example, as is the case with Example 1, it is possible to prevent the light-transmitting region 104 of the light-emitting device 10 from narrowing.

Example 5

Figure 20:
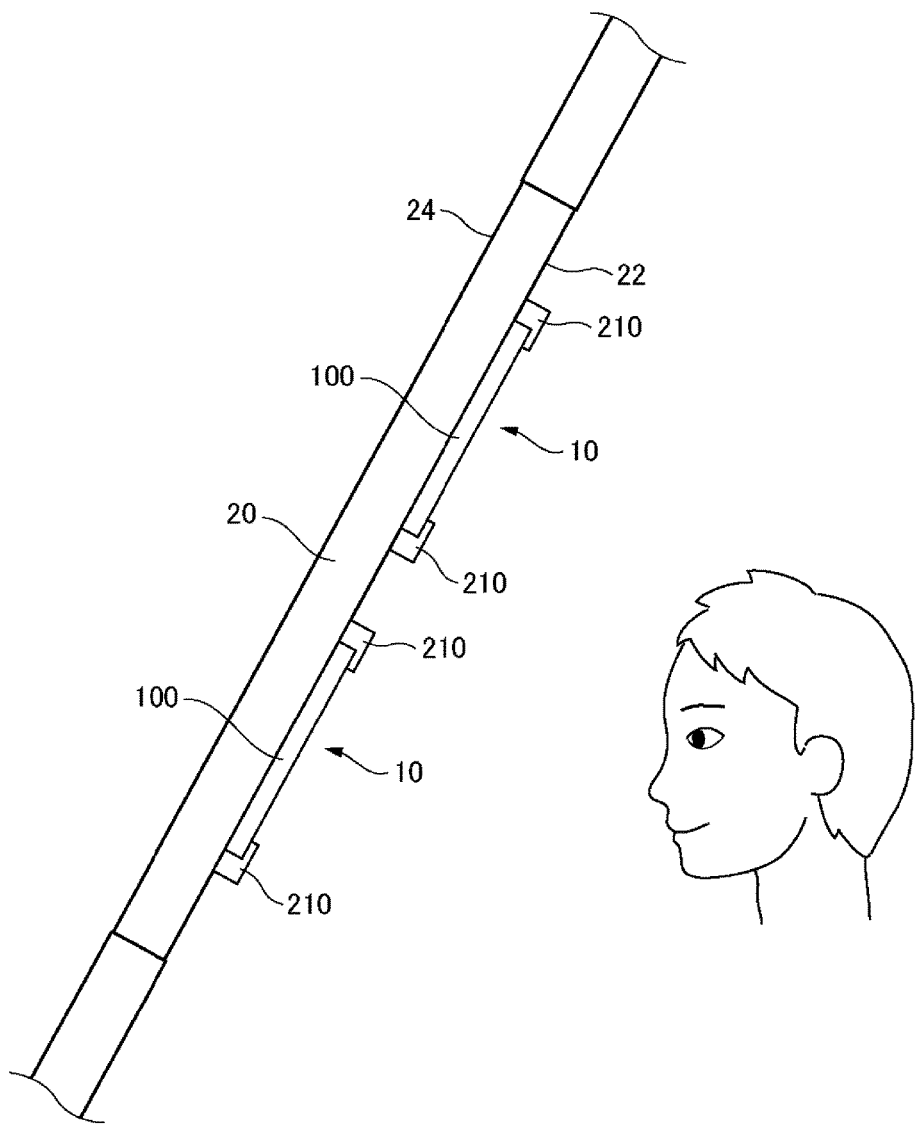
FIG. 20 is a cross-sectional view illustrating a configuration of a light-emitting system according to Example 5.

FIG. 20 is a cross-sectional view illustrating a configuration of a light-emitting system according to Example 5. The light-emitting system according to the present example has the same configuration as that of any of the embodiments, each modification example, and Examples 1 to 4 described above, except that a plurality of light-emitting devices 10 are installed on the partition member 20. Turning on and off of light in the plurality of light-emitting devices 10 may be controlled in accordance with control signals equal to or different from each other.

In the present example, it is also possible to prevent the light-transmitting region 104 of the light-emitting device 10 from narrowing.

Example 6

Figure 21:
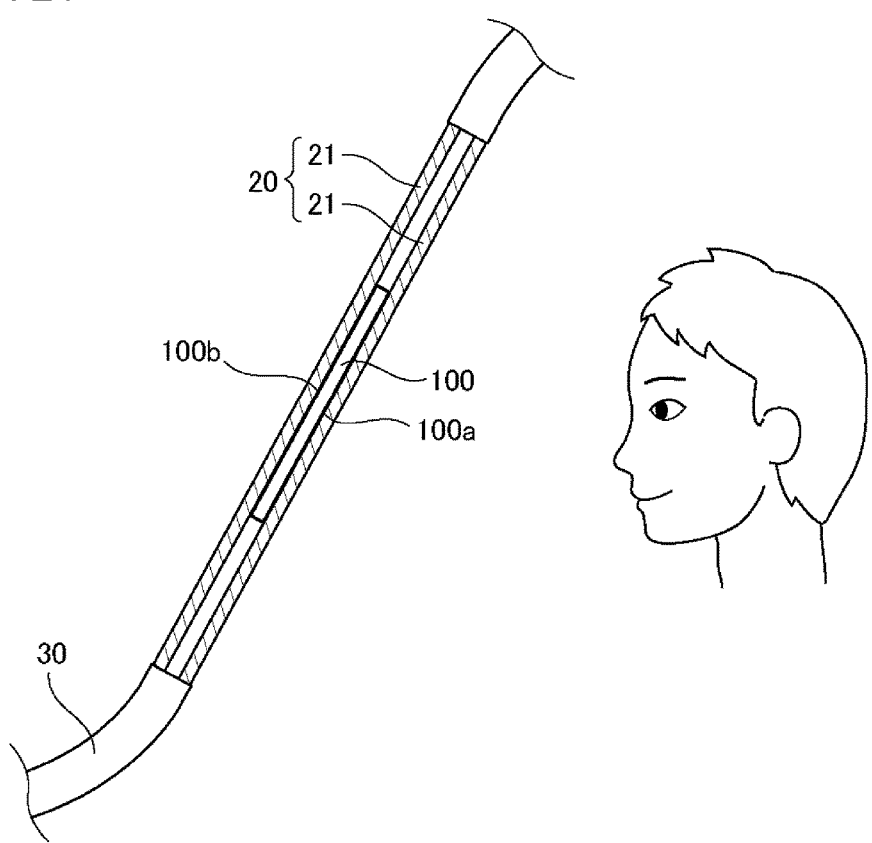
FIG. 21 is a cross-sectional view illustrating a configuration of a light-emitting system according to Example 6.

FIG. 21 is a cross-sectional view illustrating a configuration of a light-emitting system according to Example 6. The light-emitting system according to the present example has the same configuration as that of the light-emitting system according to Example 1, except for the configuration of the partition member 20 and the position of the light-emitting device 10.

In the present example, the partition member 20 has a configuration in which a plurality of light-transmitting members 21 (for example, glass plates or resin plates) overlap each other. The light-emitting device 10 is installed in the partition member 20 by being interposed between the light-transmitting members 21 next to each other.

In the present example, it is also possible to prevent the light-transmitting region 104 of the light-emitting device 10 from narrowing.

As described above, although the embodiments and examples of the present invention have been set forth with reference to the accompanying drawings, they are merely illustrative of the present invention, and various configurations other than those stated above can be adopted.

This application claims priority from Japanese Patent Application No. 2015-035822 filed on Feb. 25, 2015, the content of which is incorporated herein by reference in its entirety.

The invention claimed is:
1. A light-emitting device comprising:
a light-transmitting substrate; and
a light-emitting unit on a first surface of the substrate, wherein the light-emitting unit includes a first electrode, a second electrode that is reflective, and an organic layer between the first electrode and the second electrode wherein the organic layer is in direct contact with the first electrode and the second electrode, and at least an end portion of the second electrode that is located outside the light-emitting unit is oxidized and is in direct contact with the organic layer.

2. The light-emitting device according to claim 1, wherein a film thickness of the end portion is smaller than a film thickness of the portion of the second electrode other than the end portion.

3. The light-emitting device according to any claim 1, further comprising an insulating layer that covers an edge of the first electrode, wherein the end portion is located over the insulating layer.

4. The light-emitting device according to claim 1, further comprising a light-transmitting region next to the light-emitting unit, wherein the light-transmitting region transmits visible light.

5. The light-emitting device according to claim 4, further comprising a plurality of the light-emitting units,
wherein the light-transmitting region is between the plurality of light-emitting units.

6. The light-emitting device according to claim 1, wherein the second electrode contains aluminum.

7. The light-emitting device according to claim 1, further comprising a light diffusion layer on a second surface of the substrate,
wherein the light diffusion layer overlaps at least the end portion of the second electrode.

8. The light-emitting device according to claim 1,
wherein the end portion includes an oxidized portion, and an end of the oxidized portion toward the center of the second electrode is located outside the light-emitting unit.

9. The light-emitting device according to claim 3,
wherein the end portion includes an oxidized portion, and an end of the oxidized portion toward the center of the second electrode is located over the insulating layer.

10. The light-emitting device according to claim 1,
wherein the end portion includes an oxidized portion in a thickness direction, and
a lower surface of the oxidized portion is not in contact with the organic layer.

11. The light-emitting device according to claim 1,
wherein the end portion includes an oxidized portion, and the oxidized portion is oxidized in its entire thickness in a direction perpendicular to the substrate.

12. The light-emitting device according to claim 1,
wherein the end portion of the second electrode that is oxidized has a higher visible light transmittance than a visible light transmittance of a portion of the second electrode other than the end portion.

13. A light-emitting device comprising:
a light-transmitting substrate; and
a light-emitting unit on a first surface of the substrate,
wherein the light-emitting unit includes a first electrode, a second electrode, and an organic layer between the first electrode and the second electrode wherein the organic layer is in direct contact with the first electrode and the second electrode, and
the second electrode extends outside the light-emitting unit into a light-transmitting region, at least an end portion of the second electrode located inside the light-transmitting region being oxidized and in direct contact with the organic layer, wherein the end portion has a higher visible light transmittance than another portion of the second electrode.

14. A light-emitting device comprising:
a light-transmitting substrate; and
a light-emitting unit on a first surface of the substrate,
wherein the light-emitting unit includes a first electrode, a second electrode, and an organic layer between the first electrode and the second electrode wherein the organic layer is in direct contact with the first electrode and the second electrode,
further comprising a light-transmitting region located next to the light-emitting unit, the light-transmitting region transmitting visible light,
wherein the second electrode is in direct contact with the organic layer and extends outside the light-emitting unit into the light-transmitting region, at least an end portion of the second electrode located outside the light-emitting unit being oxidized, and a portion of the organic layer is formed in the light-transmitting region and transmits visible light.

15. A method of manufacturing a light-emitting device, comprising:
forming a first electrode over a light-transmitting substrate;
forming an insulating layer that covers an edge of the first electrode and defines a light-emitting unit;
forming an organic layer over the first electrode such that the organic layer is in direct contact with the first electrode;
forming a second electrode over the organic layer such that the second electrode is in direct contact with the organic layer; and
oxidizing an end portion of the second electrode located outside the light-emitting unit such that the end portion of the second electrode is in direct contact with the organic layer.

16. The method of manufacturing a light-emitting device according to claim 15, wherein the oxidizing the end portion comprises irradiating the end portion with a laser beam.

17. The method of manufacturing a light-emitting device according to claim 16, wherein the oxidizing the end portion comprises exposing the end portion to an oxidizing atmosphere.

18. The method of manufacturing a light-emitting device according to claim 17, wherein the oxidizing atmosphere contains at least one of N2O, H2O2, O2 and O3.

19. A light-emitting system comprising:
a light-transmitting partition member that partitions a space from an exterior thereof;
a light-transmitting substrate on a surface of the partition member at the space; and
a light-emitting unit on the substrate,
wherein the light-emitting unit includes a first electrode, a second electrode that is reflective, and an organic layer between the first electrode and the second electrode wherein the organic layer is in direct contact with the first electrode and the second electrode, and
at least an end portion of the second electrode located outside the light-emitting unit is oxidized and is in direct contact with the organic layer.

20. A light emitting device comprising:
a plurality of light-emitting units, each including a first electrode, an organic layer, and a second electrode having light-shielding properties, which are laminated over a first surface of a substrate, wherein the organic layer is in direct contact with the first electrode and the second electrode, and a light-transmitting region that transmits visible light,
wherein an end portion of the second electrode located outside the light-emitting unit in direct contact with the organic layer includes an oxidized portion thickness direction at least at an end of the second electrode, and
the light-transmitting region includes the oxidized portion and is provided between oxidized portions next to each other.

* * * * *